United States Patent
Shimoda et al.

(10) Patent No.: US 7,285,152 B2
(45) Date of Patent: Oct. 23, 2007

(54) METHOD OF MANUFACTURING CHAIN-STRUCTURE METAL POWDER

(75) Inventors: Kohei Shimoda, Osaka (JP); Masatoshi Majima, Osaka (JP); Keiji Koyama, Osaka (JP); Issei Okada, Osaka (JP); Tetsuya Kuwabara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 681 days.

(21) Appl. No.: 10/782,909

(22) Filed: Feb. 23, 2004

(65) Prior Publication Data

US 2004/0221683 A1    Nov. 11, 2004

(30) Foreign Application Priority Data

May 8, 2003   (JP) .............................. 2003-129657

(51) Int. Cl.
    *B22F 9/24* (2006.01)
(52) U.S. Cl. ....................................... 75/374
(58) Field of Classification Search ................... 75/374
    See application file for complete search history.

(56) References Cited

U.S. PATENT DOCUMENTS 4,217,152 A * 8/1980 Aonuma et al. ............ 148/108
6,379,845 B1 * 4/2002 Inazawa et al. ............. 429/235
2004/0058138 A1 * 3/2004 Inazawa et al. ............. 428/209

FOREIGN PATENT DOCUMENTS

| EP | 1 120 181 A | 8/2001 |
| JP | 5-81924 A | 4/1993 |
| JP | 05-267191 A | 10/1993 |
| JP | 08-218172 A | 8/1996 |
| JP | 2002-60825 A | 2/2002 |
| WO | WO 03/019579 A1 | 3/2003 |

OTHER PUBLICATIONS

European Search Report for Corresponding European Patent Application No. EP 4 252 631, dispatched Jun. 4, 2006.
Japanese Office Action for Corresponding Patent Application No. JP 2002-058149, dispatched Mar. 14, 2006.

* cited by examiner

*Primary Examiner*—Roy King
*Assistant Examiner*—Ngoclan T. Mai
(74) *Attorney, Agent, or Firm*—McDermott Will & Emery LLP

(57) ABSTRACT

A method of manufacturing the chain-structure metal powder comprises precipitating a metal powder by a reaction performed in an aqueous solution in which nickel ions, complex ions, and titanium ions containing trivalent titanium ions ($Ti^{3+}$) and tetravalent titanium ions ($Ti^{4+}$) are present.

2 Claims, 1 Drawing Sheet

FIGURE
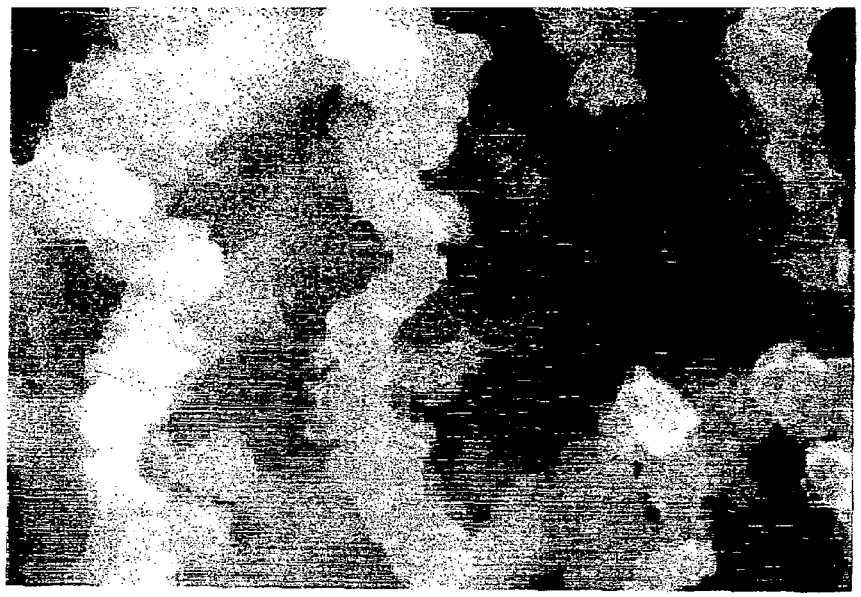

METHOD OF MANUFACTURING CHAIN-STRUCTURE METAL POWDER

BACKGROUND OF THE INVENTION

1. Field of the Invention

The present invention relates to chain-structure metal powders which are mixed with insulative materials, such as resins, rubbers, and adhesives, in order to afford electrical conductivity to such insulative materials, and to a manufacturing method of the chain-structure metal powders. In addition, the present invention relates to conductivity-afforded materials such as electrically conductive resins, electrically conductive films, electrically conductive adhesives, electrically conductive paints, and the like, which are used, for example, for electronic devices such as computers and mobile phones, and construction materials.

2. Description of the Related Art

In electronic devices, such as computers and mobile phones, and construction materials, electrical conductive resins, electrical conductive rubbers, electrical conductive films, electrical conductive adhesives, electrical conductive paints, and the like have been widely used as substitutes of solder or brazing materials for mounting or assembling electronic parts for electrostatic prevention, radio wave absorption, electromagnetic shields, etc.

In many cases, various kinds of such electrically conductive resins, rubbers, films, adhesives, paints, and the like are composites made by adding a carbon or metal powder to an insulative material such as a resin, rubber, or adhesive. For example, such composites are disclosed in Japanese Unexamined Patent Application Publication Nos. H5-81924 and 2002-60625.

However, even a carbon powder having high electrical conductivity has a high volume resistivity of approximately 1 $\Omega \cdot cm$; hence, it has been difficult to form an electrically conductive resin, rubber, film, adhesive, or paint which is superior in electrical conductivity.

On the other hand, a metal powder is superior in electrical conductivity, having a volume resistivity in the range of $10^{-6}$ $\Omega \cdot cm$. However, since particles of a metal powder are generally in the form of a sphere, oval, or scale, a large amount thereof, such as at least 20 percent by volume and preferably 30 percent by volume or more, must be added in order to afford stable conductivity to a resin, rubber, film, adhesive, and paint. As a result, in addition to economic disadvantages such as increase in cost, the addition of a metal powder has been a cause of problems such as serious side effects on the properties of an electrically conductive resin, rubber, film, adhesive, or paint. For example, the plastic deformability and/or adhesion strength of a resin may be degraded.

SUMMARY OF THE INVENTION

An object of the present invention is to provide a metal powder having superior conductivity and being capable of bestowing the conductivity with a small amount thereof, such as less than 15 percent by volume, on an insulating material such as a resin, a rubber, or an adhesive. Another object of the present invention is to provide a conductivity-afforded material such as electrically conductive resin, rubber, film, adhesive, and paint, which are used, for example, for electronic devices, such as computers and mobile phones, and construction materials.

In accordance with one aspect of the present invention, there is provided a metal powder (hereinafter referred to as a "chain-structure metal powder") comprising nickel or an alloy thereof in which particles thereof are collected together to form chain-structure particle aggregates, wherein the average diameter of the particle aggregates is in the range of 30 nm to 200 nm, and the average length thereof is in the range of 0.5 μm to 50 μm. In the chain-structure metal powder described above, the oxygen content of the metal powder and the specific surface area thereof measured by a BET adsorption method preferably satisfy the relationship represented by $0.17 \leq x/s \leq 0.83$, in which x represents the oxygen content (percent by weight) and s represents the specific surface area ($m^2/g$) so that the metal powder has good wettability to a resin or the like when it is mixed therewith.

In accordance with another aspect of the present invention, there is provided a method of manufacturing the chain-structure metal powder described above, comprising: precipitating a metal powder by a reaction performed in an aqueous solution in which nickel ions, complex ions, and titanium ions containing trivalent titanium ions ($Ti^{3+}$) and tetravalent titanium ions ($Ti^{4+}$) are present, wherein in the aqueous solution before the reaction starts, the concentration (Ni) of the nickel ions and the concentration ($Ti^{3+}$) of the trivalent titanium ions satisfy $Ti^{3+} \geq 2.5 \times Ni$, and the concentration ($Ti^{3+}$) of the trivalent titanium ions and the concentration ($Ti^{4+}$) of the tetravalent titanium ions satisfy $0.15 \leq Ti^{3+}/Ti^{4+} \leq 30$. It is obvious that another manufacturing method may also be used instead of the above-described method; however, according to the method of the present invention, the chain-structure metal powder can easily be obtained, and an oxide film which will not deteriorate the electrical conductivity can be obtained on the surface of the metal powder.

In view of combination with the nickel ions, citric acid ions are preferably used as the complex ions.

In accordance with still another aspect of the present invention, there is provided a conductivity-afforded material formed by mixing the chain-structure metal powder described above with a resin, a rubber, or an adhesive. When the amount of the powder is 15 percent by volume or less, it is economically advantageous, whereas sufficient electrical conductivity can be obtained.

Since the metal powder of the present invention has a small bulk density, and metal particles thereof are integrated in a chain-structure aggregate, a conductivity-afforded material having relatively high conductivity can be obtained even when a relatively small amount of the metal powder is used for affording conductivity. In addition, since the metal powder has an appropriate oxide on the surface thereof, it has superior wettability to a resin or the like.

BRIEF DESCRIPTION OF THE DRAWINGS

FIGURE is an enlarged photograph showing an external view of a chain-structure metal powder of the present invention.

DESCRIPTION OF THE PREFERRED EMBODIMENTS

A metal powder of the present invention (hereinafter referred to as a "chain-structure metal powder") is composed of fine particles made of nickel or an alloy thereof, in which the particles are collected together to form particle aggregates in the form of chains having extending branches like a tree. Because of the structure described above, when the metal powder is present in an insulating material such as a resin or the like, the metal powder builds a network in the form of chains, and as a result, the conductivity can be afforded to the insulative material by adding a relatively small amount of the chain-structure metal powder as compared with a metal powder composed of particles in the form of a sphere, oval, or scale. In addition, the structural effect of the chain-structure particle aggregates of the metal powder enables the metal powder to afford sufficient conductivity without need of dense filling thereof, that is, by addition of a small amount of the metal powder.

A suitable metal for the present invention is nickel or an alloy thereof. This is because the electrical conductivity of metal nickel is relatively superior among metals; the volume resistivity thereof is $6.8\times10^{-6}$ $\Omega\cdot$cm, and because the degradation of electrical conductivity due to oxidation is unlikely to occur since metal nickel has superior oxidation resistance as compared with to copper or the like. Accordingly, nickel can preferably be used as a conductive material. In addition, because of intrinsic magnetic properties of metal nickel, metal microcrystals tend to be oriented in the axis direction in the manufacturing method which will be described later, and hence the chain-structure particle aggregates can be easily formed. In the case where the metal nickel described above is used as a conductive material, due to the chain-structure particle aggregates, electrical conductive paths can be easily formed when electricity is applied. In consideration of the conductivity and the formation of the electrical conductive paths described above, nickel is selected. Metal elements such as iron, cobalt, and chromium may also be added to the extent that the content of nickel is 50 percent by weight or more; however, when the content of nickel is less than 50 percent by weight, the addition of such metal elements is undesirable since the conductivity becomes insufficient.

When the average aggregate diameter of the chain-structure metal powder of the present invention is in the range of 30 nm to 200 nm, and the average length thereof is in the range of 0.5 μm to 50 μm, since thin and long particle aggregates of the metal powder form a network in the form of chains, a conductivity bestowing effect particularly becomes significant, the conductivity can be bestowed on an insulating material by the addition of a small amount of the metal powder, and as a result, superior conductive material can also be obtained. When the average diameter of particle aggregates of the metal powder is less than 30 nm, the chain-structure metal powder may tend to be pulverized when mixed with an insulative material such as a resin or a rubber, resulting in a small conductivity affording effect such that a chain-shaped network of the metal powder may not be formed sufficiently in the insulating material.

When the average diameter of particle aggregates the metal powder is more than 200 nm, a larger amount of the metal powder necessary for forming a chain-shaped network, which makes it difficult to afford conductivity to an insulative material by adding a small amount of the metal powder.

In the case in which the average particle aggregate length of the metal powder is less than 0.5 μm, its conductivity bestowing effect disadvantageously becomes small, since it is unlikely that a chain-shaped network of the metal powder will be formed in an insulative material such as a resin or a rubber when the metal powder is mixed with such an insulative material.

If the average particle aggregate length of the metal powder is more than 50 μm, the metal powder is liable to be pulverized, and in addition, it becomes difficult to uniformly disperse the metal powder in an insulative material such as a resin or a rubber, which results in the decreased conductivity bestowing effect and adversely large variation in electrical conductive properties after mixing. Furthermore, large variation in electrical conductive properties after mixing also disadvantageously occurs.

Since the metal powder described above has sufficient irregularities on the surface thereof, it is superior in mixability such that it is well intermingled when mixed with a resin or a rubber. The metal powder exhibits superior mixing wettability when it has an oxide layer formed on the surface thereof, and hence, it is preferable that the oxygen content and the specific surface area obtained by a BET adsorption method in the metal powder of the present invention satisfy the equation: $0.17 \leq x/s \leq 0.83$, in which x represents the oxygen content (percent by weight) and s represents the specific surface area ($m^2/g$) In the case of $0.17 > x/s$, since the amount of oxide on the surface of the metal powder is small, the wettability to a resin or a rubber diminishes, and as a result, minute bubbles may tend to be generated in a sheet product formed from an insulating material mixed with the metal powder. As a result, the conductivity of a sheet product is likely to vary. On the other hand, in the case of $x/s > 0.83$, since the oxide layer on the metal surface becomes larger and serves as an insulator, the conductivity tends to decrease.

The chain-structure metal powder of the present invention is formed by the following method.

The method of the present invention is generally based on liquid phase reduction in which metal ions in an aqueous solution are reduced. The method uses an aqueous solution formed by mixing three kinds of aqueous solutions at a predetermined mixing ratio: an aqueous solution containing nickel ions or metal ions for forming a nickel alloy, which are to be reduced; an aqueous solution containing complex ions; and an aqueous titanium ion solution containing trivalent titanium ions functioning as a reducing agent. The predetermined mixing ratio satisfies the relationship $Ti^{3+} \leq 2.5 \times Ni$, in which $Ti^{3+}$ indicates the concentration of trivalent titanium ions, and Ni indicates the concentration of nickel ions. If the condition described above is not satisfied, Ni particles having the shape of a sphere or oval will be formed, and as a result, a desired chain-structure metal powder cannot be obtained.

In the aqueous titanium ion solution described above, tetravalent titanium ions are also present in addition to the trivalent titanium ions. The obtainable stability of reaction depends on the ratio between the tetravalent titanium ions and the trivalent titanium ions. The ratio described above is controlled so that $0.15 \leq Ti^{3+}/Ti^{4+} \leq 30$ is satisfied in which $Ti^{3+}$ indicates the concentration of the trivalent titanium ions, and $Ti^{4+}$ indicates the concentration of the tetravalent titanium ions. When this value is less than 0.15, the reaction rate is slow and hence is not advantageous from the economic point of view. In addition, the oxide layer at the surface of the product is excessively grown. On the other hand, it is undesirable when the value described above is more than 30 because the reaction rate is too fast and the oxide layer on the surface of a product is insufficiently grown.

One reason for adopting the above-mentioned mixing ratio is that thereby a chain-structure metal powder can be stably formed. Another reason is that since an appropriate oxide layer is formed on the surface of the chain-structure Ni-base metal powder thus formed, the wettability of the metal powder to a resin, a film, an adhesive, or a paint is improved, the metal powder is uniformly dispersed in a resin or the like, and as a result, the conductivity bestowing effect can be enhanced.

As for the mechanism, clusters of trivalent titanium ions and tetravalent titanium ions are formed such that a chain-structure metal powder is then easily produced by a reaction using the titanium ion clusters, and in addition a dense metal texture is formed by an appropriate reducing force, whereby a dense oxide layer which is not excessively oxidized can be formed.

The above-mentioned aqueous solution is mixed with an aqueous ammonia solution or the like so that the pH thereof is set to approximately 9, and subsequently stirred while being maintained at room temperature or heated to approximately 50° C. so that a chain-structure metal powder can be obtained. By the conditions of pH, temperature, reaction time, and the like, the branched shape, the diameter, the length, and the like of the particle aggregates of the metal powder can be optionally changed. The trivalent titanium ions, which are used as a reducing agent and are present in the aqueous solution, are oxidized into tetravalent titanium ions. As for the complex ions for forming a complex, citrate ions, tartrate ions, acetate ions, gluconate ions, and ammonium ions are preferably used, and among them, particularly citrate ions are suitably used for forming the chain-structure metal powder of the present invention.

The chain-structure metal powder thus formed exhibits the effect as a conductivity affording material when it is mixed with a resin, a rubber, or an adhesive. With the chain-structure metal powder of the present invention a network of conductive substance is likely to be formed easily as compared with a conventional metal powder composed of particles in the form of sphere, oval, or flake, and accordingly, the amount of the metal powder for obtaining the conductivity can be decreased. The mixing ratio is preferably set to 15 percent by volume or less.

EMBODIMENTS

Hereinafter, examples of the chain-structure metal powder and the conductivity afforded material of the present invention will be described; however, the present invention is not limited to the examples.

EXAMPLE 1

First, 0.03 mol of $NiCl_2$ and 0.15 mol of citric acid were dissolved in purified water at a solution temperature of 25° C. An aqueous ammonia solution at a concentration of 28% was added thereto, thereby preparing 1 liter of a solution A at a pH of 9. In addition, $TiCl_3$ and $TiCl_4$ were dissolved in purified water at a solution temperature of 25° C., thereby preparing 1 liter of a solution B containing $Ti^{3+}$ at a concentration of 0.08 mol/L and $Ti^{4+}$ at a concentration of 0.50 mol/L. These solutions satisfied $Ti^{3+} \geq 2.5 \times Ni$ and $Ti^{3+}/Ti^{4+}=0.16$.

While being maintained at a solution temperature of 25° C., the solution A and the solution B were allowed to react with each other for 30 minutes, a nickel powder thus formed was collected from a reaction solution, followed by washing and drying, thereby forming a nickel powder.

The observation of this powder through a scanning electron microscope (SEM) at a magnification of 100,000 confirmed that it was a chain-structure nickel powder in which the average diameter and the average length of particle aggregates were 50 nm and 20 μm, respectively.

EXAMPLES 2 TO 6, COMPARATIVE EXAMPLES 1 TO 4

As in Example 1, $NiCl_2$ solutions having concentrations as shown in Table I was prepared. The concentration of citric acid was adjusted in proportion to the Ni ion concentration such that solutions A were prepared. In addition, the pH and the solution temperature were controlled as indicated in Table I.

In addition, solutions B were prepared in which the titanium ion concentration and the solution temperature were different, respectively as shown in Table I. One liter each of solutions A and 1 liter each of solutions B were mixed together and were allowed to react with each other as in Example 1 so that each nickel powder of the examples and the comparative examples was prepared. The shapes of the nickel powders thus obtained were observed using an SEM, and the average sizes of particle aggregates of the powders are as shown in Table I.

The conductivities obtained by using the metal powders of the examples and the comparative examples were compared in a manner such that each of the metal powders thus prepared was added to a chlorinated polyethylene rubber heated to 150° C., followed by roll-mill mixing and rolling, thereby forming a conductive rubber sheet having a thickness of 0.5 mm.

Two types of conductive rubber sheets containing 5 percent and 11 percent by volume of the metal powder were formed respectively. The results of the volume resistivity of the sheets measured by a four-probe method are also shown in Table I.

TABLE I

| | $Ni^{2+}$ mol/L | $Ti^{3+}$ mol/L | $Ti^{4+}$ mol/L | Reaction temperature (° C.) | Reaction Condition pH | Diameter (nm) | Length (μm) | Volume resistivity at 5 vol % ($10^{-2}$ Ω·cm) | Volume resistivity at 11 vol % ($10^{-2}$ Ω·cm) |
|---|---|---|---|---|---|---|---|---|---|
| Example 1 | 0.03 | 0.08 | 0.500 | 25 | 9.0 | 50 | 20 | 28.6 | 6.5 |
| Example 2 | 0.03 | 0.08 | 0.500 | 50 | 9.0 | 100 | 25 | 20.2 | 4.2 |
| Example 3 | 0.03 | 0.08 | 0.020 | 50 | 9.0 | 180 | 25 | 7.7 | 1.1 |
| Example 4 | 0.03 | 0.08 | 0.018 | 50 | 9.0 | 200 | 25 | 7.0 | 1.0 |
| Example 5 | 0.03 | 0.08 | 0.020 | 50 | 9.5 | 120 | 0.5 | 8.8 | 1.4 |
| Example 6 | 0.03 | 0.08 | 0.020 | 50 | 8.5 | 200 | 50 | 6.8 | 0.9 |
| Comparative Example 1 | 0.03 | 0.08 | 0.002 | 50 | 9.0 | 20 | 20 | 156.0 | 58.3 |
| Comparative Example 2 | 0.01 | 0.02 | 0.100 | 15 | 9.0 | Chain structure was not formed. | | 386.0 | 188.0 |

TABLE I-continued

| | $Ni^{2+}$ mol/L | $Ti^{3+}$ mol/L | $Ti^{4+}$ mol/L | Reaction temperature (° C.) | Reaction Condition pH | Diameter (nm) | Length (μm) | Volume resistivity at 5 vol % ($10^{-2}$ Ω·cm) | Volume resistivity at 11 vol % ($10^{-2}$ Ω·cm) |
|---|---|---|---|---|---|---|---|---|---|
| Comparative Example 3 | 0.03 | 0.08 | 0.010 | 50 | 9.0 | 600 | 20 | 73.0 | 24.0 |
| Comparative Example 4 | 0.03 | 0.08 | 0.020 | 50 | 8.0 | 200 | 80 | 101.0 | 33.6 |

In Examples 1 to 6, as shown in Table I, chain-structure metal powders were obtained because the conditions of the preparation satisfied the relationships $Ti^{3+} \geq 2.5 \times Ni$ and $0.15 \leq Ti^{3+}/Ti^{4+} \leq 30$. In addition, the powders thus formed had good affinity to a chlorinated polyethylene rubber having insulating properties, and as a result, even with a small content of metal powder as compared with a conventional method, the resultant conductivity afforded materials exhibited sufficient conductivity.

Because of its small diameter as compared with the case of the examples described above, the chain-structure metal powder obtained in Comparative Example 1 was pulverized when mixed with a chlorinated polyethylene rubber, and as a result, the conductivity obtained was inferior.

The metal powder formed in Comparative Example 2 did not contain particle aggregates having a chain-structure. The conductivity afforded material formed from this metal powder was vastly inferior.

The chain-structure metal powders of Comparative Examples 3 and 4 had a large diameter, and the conductivity of the conductivity afforded materials was slightly degraded. In Comparative Example 4, because of the long length of the metal powder, uniform mixing could not be achieved when the metal powder was mixed with a chlorinated polyethylene rubber, and as a result, the conductivity of a conductivity afforded material as a bulk was degraded.

EXAMPLE 7

First, 0.02 mol of $NiCl_2$ and 0.10 mol of citric acid were dissolved in purified water at a solution temperature of 15° C., and an aqueous. ammonia solution at a concentration of 28% was added thereto so that 1 liter of a solution A at a pH of 9 was prepared. On the other hand, $TiCl_3$ and $TiCl_4$ were dissolved in purified water at a solution temperature of 15° C. so 1 liter of a solution B containing $Ti^{3+}$ at a concentration of 0.08 mol/L and $Ti^{4+}$ at a concentration of 0.003 mol/L was prepared. These solutions satisfied $Ti^{3+} \geq 2.5 \times Ni$ and $Ti^{3+}/Ti^{4+} = 26.7$.

While maintained at a solution temperature of 15° C., the solution A and the solution B were allowed to react with each other for 30 minutes, a nickel powder thus formed was recovered from a reaction solution, followed by washing and drying, thereby forming a nickel powder.

This powder was confirmed to be a chain-structure nickel powder by the observation through an SEM at a magnification of 100,000. The average diameter and the average length of particle aggregates of this powder were 150 nm and 38 μm, respectively.

In addition, by using a part of this metal powder, the oxygen content and the BET specific surface area of the powder, which were measured by an infrared absorption method and a BET method, were 0.51 percent by weight and 3.0 m²/g, respectively.

EXAMPLES 8 TO 10, COMPARATIVE EXAMPLES 5 AND 6

Metal powders were formed in a manner similar to that in Example 7. The manufacturing conditions are shown in Table II. When the metal powders thus formed were observed by an SEM at a magnification of 100,000, all the metal powders were each composed of chain-structure particle aggregates, and the average diameter and length thereof are also shown in Table II.

The conductivities obtained by using the metal powders of the examples and the comparative examples were compared. For this evaluation, 5 percent by volume of each of the metal powders thus formed was added to a chlorinated polyethylene rubber heated to 150° C., followed by roll-mill mixing and rolling, whereby a conductive rubber sheet having a thickness of 0.5 mm was formed.

The results of the volume resistivity of the sheets thus formed are also shown in Table II. In addition, the volume resistivity was measured at 10 different positions in the same sheet for evaluating the variation thereof. The results shown in Table II were obtained. In this Table II, the value of variation represents one sigma (σ).

TABLE II

| | | | | | | Powder Size | | Powder properties | | | Conductivity | |
|---|---|---|---|---|---|---|---|---|---|---|---|---|
| | | | | | | | | BET specific surface area (m²/g) | Oxygen content (wt %) | | Volume resistivity at 5 vol % ($10^{-2}$ Ω·cm) | Variation 1σ (%) |
| | $Ni^{2+}$ mol/L | $Ti^{3+}$ mol/L | $Ti^{4+}$ mol/L | Reaction temperature (° C.) | Reaction Condition pH | Diameter (nm) | Length (μm) | | | x/s | | |
| Example 7 | 0.02 | 0.08 | 0.003 | 15 | 9.0 | 150 | 38 | 3.00 | 0.51 | 0.17 | 6.0 | 2.5 |
| Example 8 | 0.03 | 0.08 | 0.5 | 50 | 9.0 | 100 | 25 | 4.49 | 3.11 | 0.69 | 20.2 | 2.5 |
| Example 9 | 0.03 | 0.08 | 0.018 | 50 | 9.0 | 200 | 25 | 2.25 | 0.64 | 0.28 | 7.0 | 2.3 |
| Example 10 | 0.03 | 0.08 | 0.05 | 50 | 9.0 | 180 | 20 | 2.50 | 0.78 | 0.31 | 7.6 | 2.0 |

TABLE II-continued

| | $Ni^{2+}$ mol/L | $Ti^{3+}$ mol/L | $Ti^{4+}$ mol/L | Reaction temperature (° C.) | Reaction Condition pH | Powder Size Diameter (nm) | Powder Size Length (μm) | BET specific surface area (m²/g) | Oxygen content (wt %) | x/s | Volume resistivity at 5 vol % ($10^{-2}$ Ω·cm) | Variation 1σ (%) |
|---|---|---|---|---|---|---|---|---|---|---|---|---|
| Comparative Example 5 | 0.03 | 0.08 | 0.7 | 50 | 9.0 | 100 | 25 | 4.80 | 4.57 | 0.95 | 39.0 | 5.0 |
| Comparative Example 6 | 0.03 | 0.08 | 0.002 | 15 | 9.0 | 180 | 46 | 2.50 | 0.27 | 0.11 | 21.0 | 21.0 |

As shown in Table II, since the metal powders of Examples 7 to 10 were formed in accordance with the required manufacturing conditions, a chain-structure metal powder was formed, and since the relationship between the oxygen content and the BET specific surface area satisfied $0.17 \leq x/s \leq 0.83$, the metal powder thus formed had good wettability to a chlorinated polyethylene rubber. Accordingly, although the content of the metal powders was only 5 percent by volume, the conductivity afforded materials exhibited small variation in conductivity and sufficient conductivity.

In Comparative Example 5, although a chain-structure metal powder was obtained, the oxygen content of the metal powder thus formed was high since the ratio of $Ti^{3+}$ to $Ti^{4+}$ was outside the range described above; hence, the conductivity was degraded because the oxide film formed on the metal surface functioned as a resistant layer, although the metal powder had good affinity to a chlorinated polyethylene rubber.

In Comparative Example 6, the ratio of $Ti^{3+}$ to $Ti^{4+}$ did not satisfy the required conditions described above, and consequently the oxygen content of the chain-structure metal powder thus formed was too low to allow the metal powder to have sufficient affinity to a chlorinated polyethylene rubber; hence, uniform mixing could not be achieved. Accordingly, the conductivity afforded material thus formed had a large variation in the conductivity depending on the measured portion thereof.

What is claimed is:

1. A method of manufacturing a chain-structure metal powder, comprising:
   precipitating the metal powder by a reaction performed in an aqueous solution in which nickel ions, complex ions, and titanium ions containing trivalent titanium ions and tetravalent titanium ions are present,
   wherein, in the aqueous solution before the reaction starts, the concentration (Ni) of the nickel ions and the concentration ($Ti^{3+}$) of the trivalent titanium ions satisfy $Ti^{3+} \geq 2.5 \times Ni$, and the concentration ($Ti^{3+}$) of the trivalent titanium ions and the concentration ($Ti^{4+}$) of the tetravalent titanium ions satisfy $0.15 \leq Ti^{3+}/Ti^{4+} \leq 30$.

2. The method of manufacturing a chain-structure metal powder, according to claim 1, wherein the complex ions are citrate ions.

* * * * *